United States Patent [19]

Langeraar et al.

[11] 4,188,628

[45] Feb. 12, 1980

[54] FREQUENCY MEASURING CIRCUIT IN A PASSIVE RADAR RECEIVER

[75] Inventors: Huibert B. Langeraar, Hengelo; Gerrit Van Rooijen, Haaksbergen, both of Netherlands

[73] Assignee: N.V. Hollandse Signaalapparaten, Hengelo, Netherlands

[21] Appl. No.: 898,460

[22] Filed: Apr. 20, 1978

[30] Foreign Application Priority Data

Apr. 26, 1977 [NL] Netherlands ............... 7704526

[51] Int. Cl.$^2$ .................................. G01S 9/02
[52] U.S. Cl. ........................... 343/5 SA; 324/82; 324/83 D
[58] Field of Search ............ 343/5 SA; 324/82, 83 D, 324/83 Q

[56] References Cited

U.S. PATENT DOCUMENTS

| | | | |
|---|---|---|---|
| 3,003,107 | 10/1961 | Charbonnier | 324/82 |
| 3,189,820 | 6/1965 | Lowman | 324/82 |
| 3,617,900 | 11/1971 | Fink et al. | 324/82 |

OTHER PUBLICATIONS

"Comment on Broadband Microwave Discriminator", by S. J. Robinson, *IEEE Transactions on Microwave Theory and Techniques,* vol. 12, Mar. 1964, pp. 255, 256.

*Primary Examiner*—Maynard R. Wilbur
*Assistant Examiner*—Richard E. Berger
*Attorney, Agent, or Firm*—Algy Tamoshunas

[57] ABSTRACT

Passive frequency measuring circuit comprising a number of frequency discriminators to obtain a digital code representing the frequency of an applied r.f. signal. Each discriminator is tuned to different frequency ranges, and provided with a plurality of similar frequency analysers for the phase detection of the applied r.f. signal passed through different delay lines. As each discriminator delivers an ambiguous code at the boundaries of its characteristic, a digital filter is incorporated to resolve the ambiguity. If such an ambiguity is established, an adjoining discriminator is activated to deliver information for obtaining a digital code representing an unambiguous frequency value.

13 Claims, 12 Drawing Figures

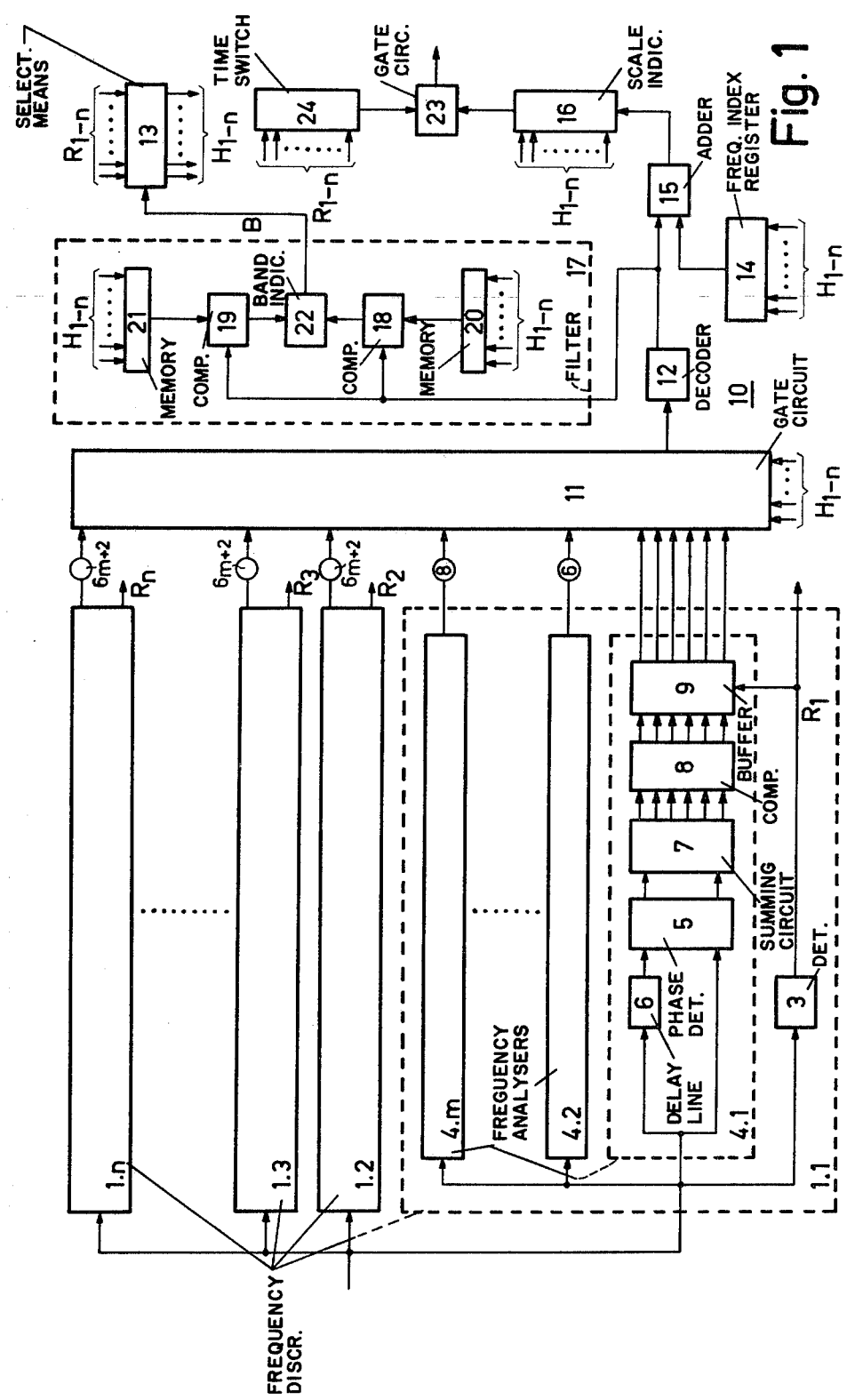

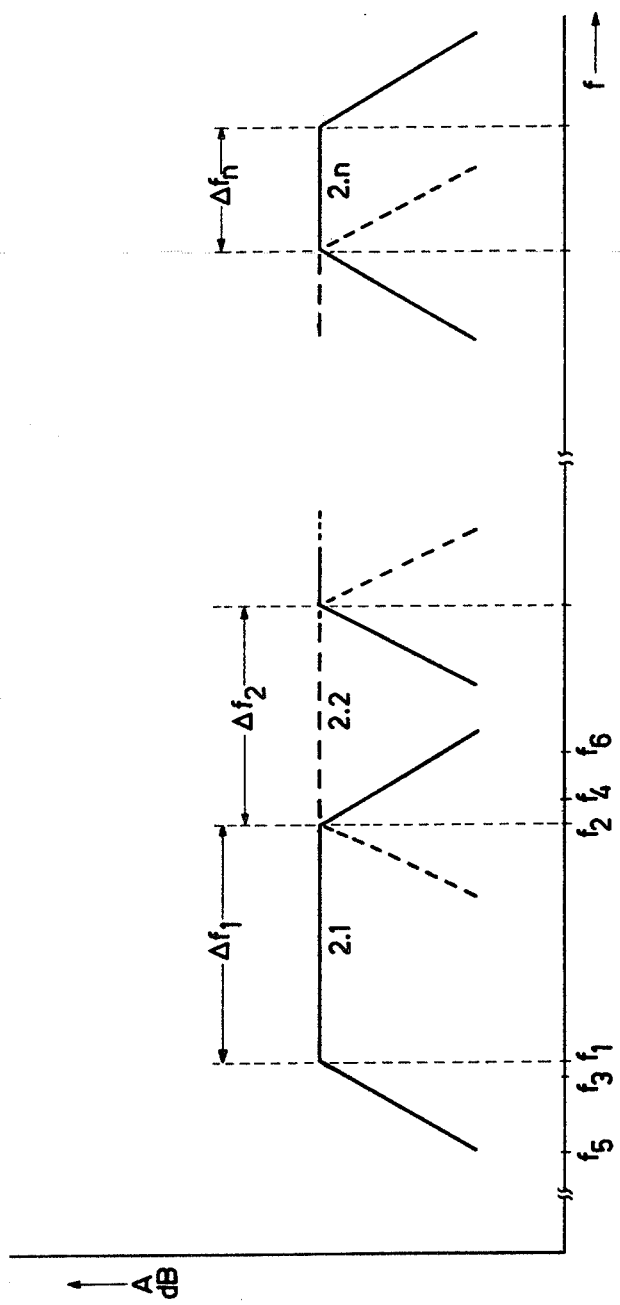

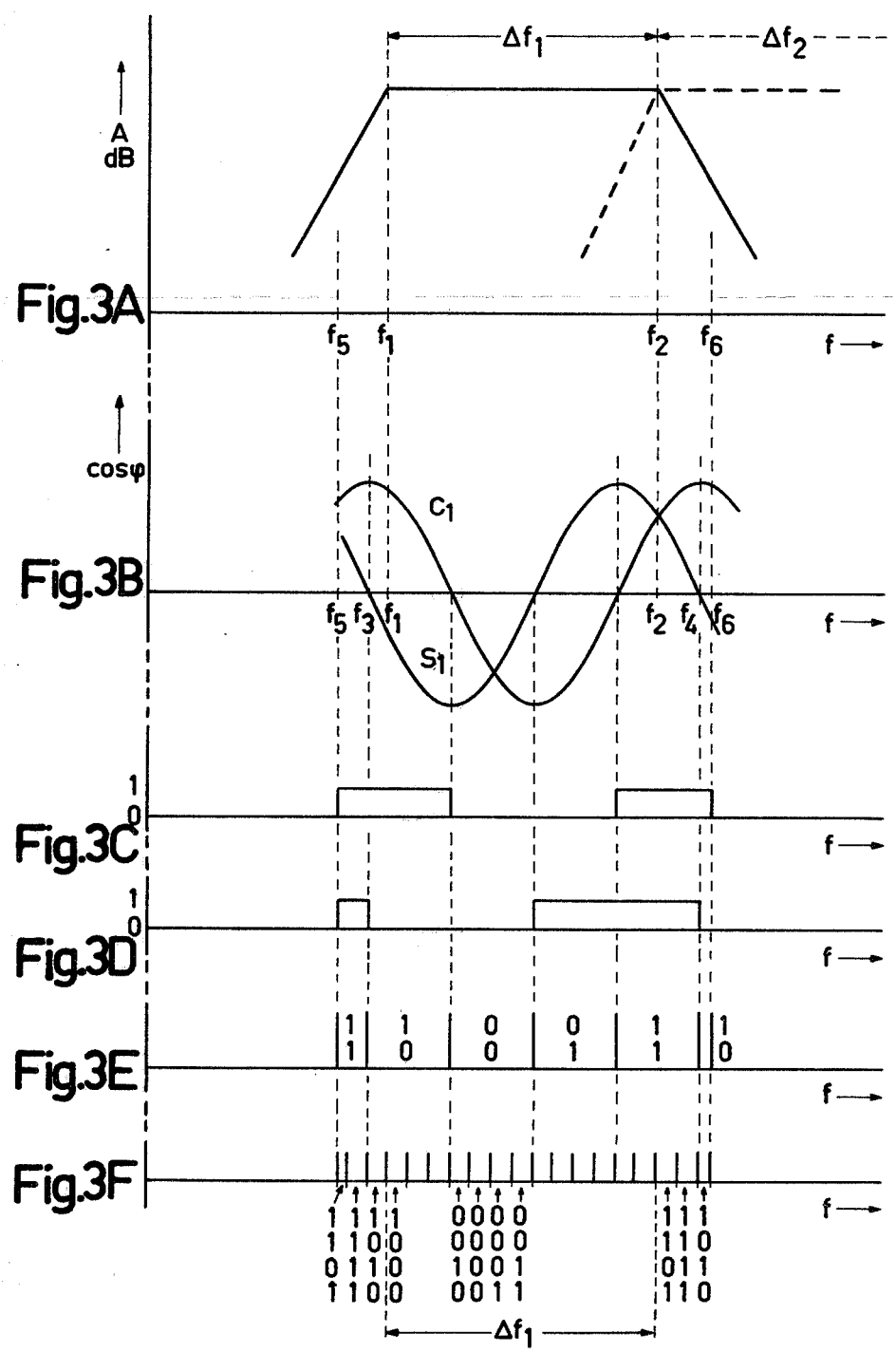

FREQUENCY MEASURING CIRCUIT IN A PASSIVE RADAR RECEIVER

The invention relates to a frequency measuring circuit in a passive radar receiver for producing a digital code representing the frequency of an applied r.f. signal.

Such a frequency measuring circuit is known from Robinson S. J.: "Comment on Broadband Microwave Discriminator", IEEE Transactions on Microwave Theory and Techniques, Vol. 12, March 1964, pp. 255,256; the measuring circuit described in this periodical is tuned to a frequency measuring band lying within the S-band. To obtain a measuring circuit having a larger measuring band, the circuit would have to be of different dimensions, giving rise to various disadvantages. One of the disadvantages of a frequency measuring circuit thus dimensioned concerns the signal-to-noise ratio, since this would deteriorate as the measuring band to be covered is increased. Another disadvantage relates to the problems incurred in obtaining the bandwidth required for the desired measuring band to minimize the signal energy losses.

It is an object of the invention to provide an improved frequency measuring circuit as set forth in the opening paragraph, whereby the above disadvantage are eliminated.

The frequency measuring circuit according to the invention comprises:

a. a number (N) of frequency discriminators, each having an ambiguous discriminator characteristic, which discriminators are tuned to different r.f. frequency ranges partly overlapping each other if they are tuned to adjoining frequency operating ranges, and which discriminators incorporate a plurality of frequency analysers for the phase detection of the applied r.f. signals in two trigonometric components, said r.f. signals being passed via delay lines of different lengths for each of the analysers, and for the binary coding of the polarity of the signals thus obtained by detection;

b. a decoder which can be connected to each of the frequency discriminators via a gate circuit and which converts the composite of binary coded polarities of the analysers pertaining to the connected discriminator into a digital code representing a frequency which may be ambiguous within the frequency range of said discriminator;

c. a digital filter being tunable to each of the discriminators and having a passband corresponding with the unambiguous part of the relevant discriminator characteristic, which digital filter delivers a signal on the application of the digital code from the decoder to indicate whether the binary representation of the frequency value within the frequency operating range of said discriminator is ambiguous or not, which digital filter, after receiving a digital code being an ambiguous representation of the frequency, opens said gate circuit for the connection of the decoder to a frequency discriminator tuned to an adjoining frequency operating range;

d. a combination circuit for producing a digital code being an unambiguous representation of the measured frequency and consisting of the digital code from said decoder and the digital code representing the frequency band of the then connected frequency discriminator.

The known frequency measuring circuit as depicted by S. J. Robinson comprises only one frequency discriminator consisting of a plurality of frequency analysers of the abovedescribed type; it should be noted that the frequency discriminator as termed by S. J. Robinson is referred to as "frequency analyser" in this description. In accordance with this terminology, a plurality of units denoted as frequency analysers in this description and tuned to the same frequency band forms a complete device termed "discriminator" in this description, which device is comparable with the entire frequency measuring circuit of S. J. Robinson.

To obtain a procedure for measuring a frequency unambiguously, the frequency analyser of a discriminator, producing the most significant bits of the digital code representing the frequency of the r.f. signal, must be so dimensioned that the phase angle of the signal to be generated by this analyser is determined unambiguously and therefore lies within a fixed phase interval of $2\pi$. Since a frequency analyser generates digital information about the polarity of the sine and cosine values of the phase angle, an unambiguous division of the above phase interval into four parts is obtained; therefore a frequency discriminator having one signal frequency analyser gives a division of the measuring band of that phase interval into four frequency intervals. A frequency measurement performed with such a discriminator answers the question of within which of the four frequency intervals the frequency of the received r.f. signal resides. If a frequency discriminator comprises n differently dimensioned frequency analysers of the above-mentioned type, a division of the frequency measuring band into $4^n$ intervals is obtained; with such a measuring circuit it is determined which of the $4^n$ intervals of the frequency measuring band contains the frequency of the received r.f. signal.

If a larger measuring is desired for a frequency measuring circuit having one single frequency discriminator, the number of analysers must be increased to retain the same measuring accuracy. All of these analysers should then have a larger bandwidth. Further, the delay lines in these analysers must be tuned to each other very accurately. All this is a difficult and very expensive matter and must be considered as a disadvantage of a frequency measuring circuit consisting of one single frequency discriminator to operate in an enlarged frequency range.

The invention will now be described with reference to six figures, of which

FIG. 1 is a block diagram of an embodiment of a frequency measuring circuit according to the invention;

FIG. 2 is a diagram illustrating the various frequency operating ranges of the discriminators contained in the frequency measuring circuit according to the invention;

Figure 4A:
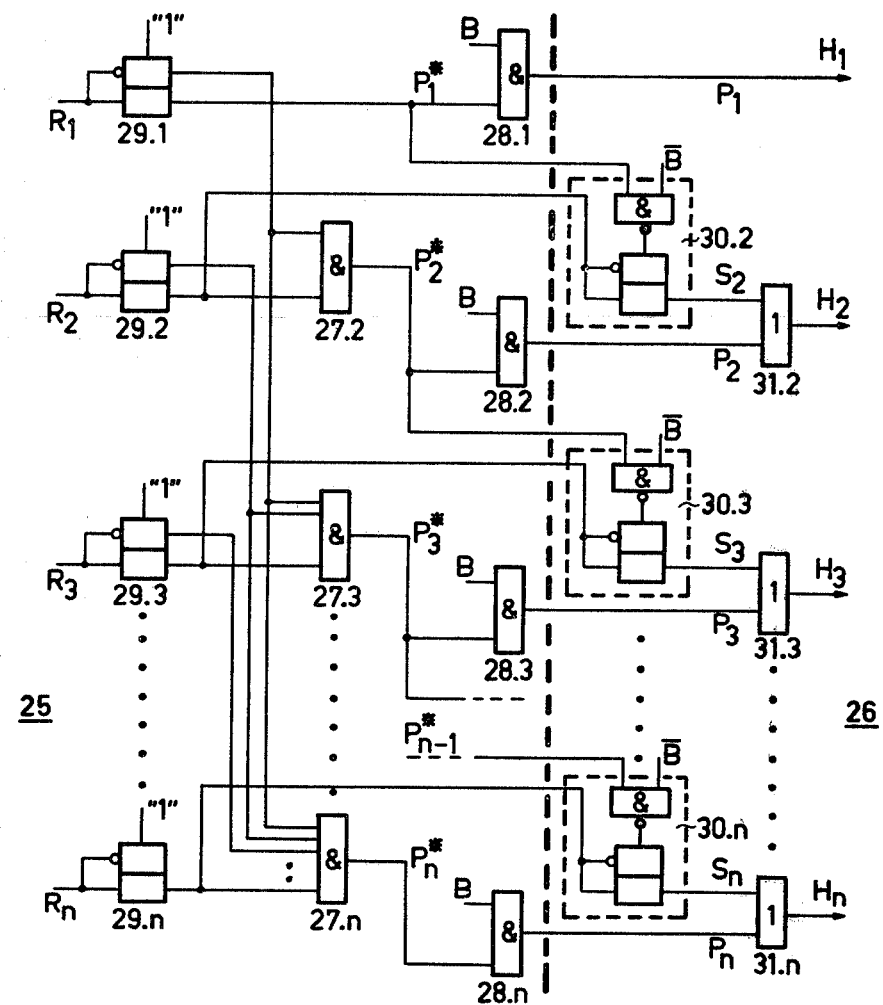
Figure 4B:
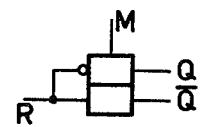
Figure 5:
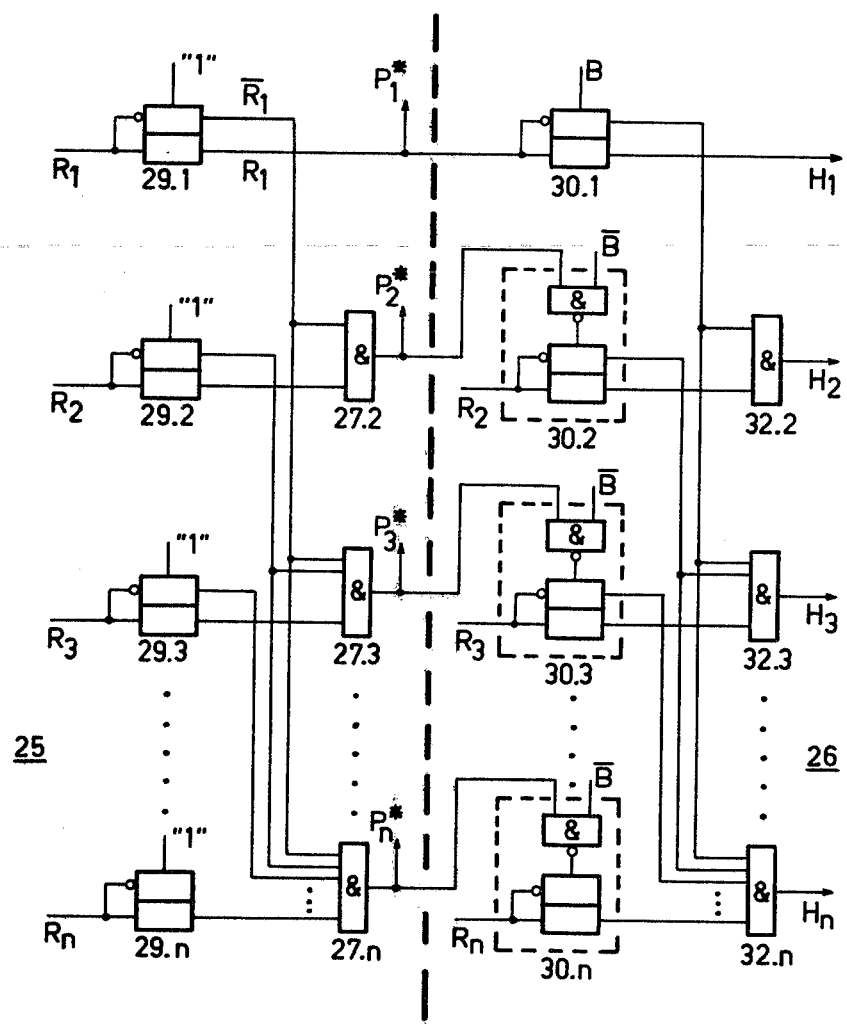
Figure 6:
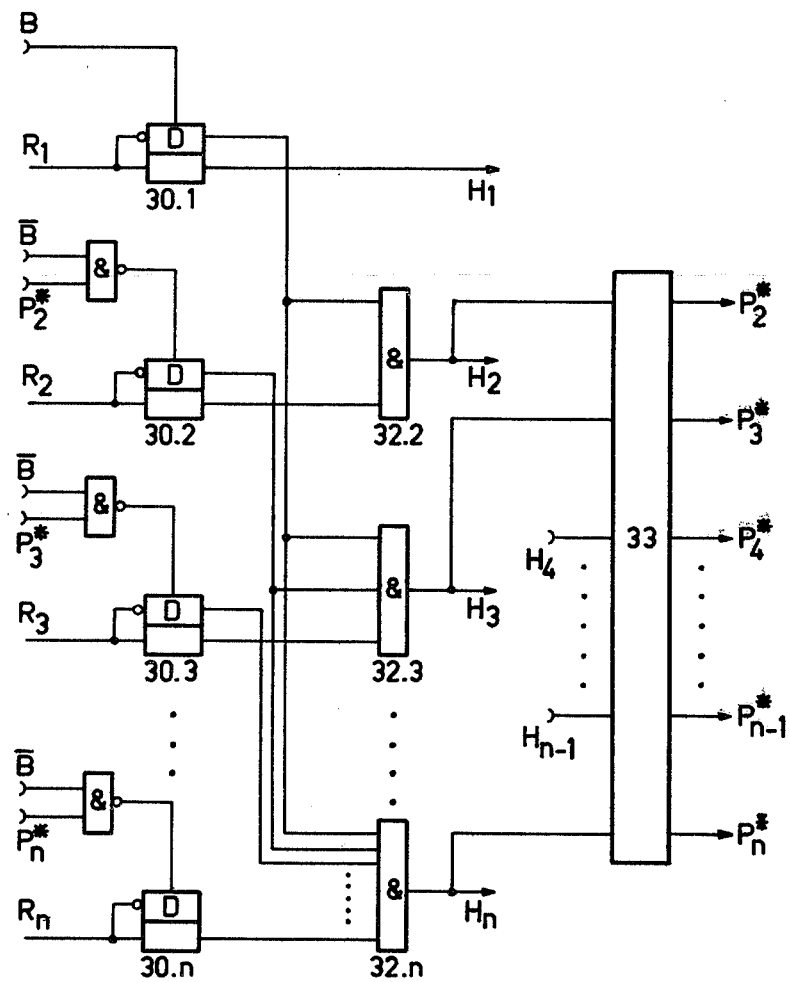

FIGS. 3A–F are diagrams illustrating the binary coding of the polarity of the trigonometric functions obtained by phase detection of the applied, delayed r.f. signals;

FIG. 4A is a block diagram illustrating an embodiment of selection means of the frequency measuring circuit according to the invention; and FIG. 4B is a block diagram illustrating an embodiment of a logic storage element of the selection means;

FIG. 5 is a block diagram illustrating another embodiment of the selection means; and FIG. 6 is a block diagram illustrating a special embodiment of the selection means.

With the description of FIG. 1 reference will be made to FIGS. 2 and 3A–F.

The frequency measuring circuit illustrated in FIG. 1 comprises a number of frequency discriminators 1.1–1.n, which operate in various r.f. frequency ranges and which have a common supply line for received signals; the characteristics thereof are shown by reference numerals 2.1–2.n in FIG. 2. Since these frequency discriminators are similar to each other, it will suffice to describe only one frequency discriminator, viz. 1.1. The frequency discriminator (with frequency operating range ($f_5;f_6$) and characteristic 2.1, see FIGS. 2 and 3A) consist of a detector 3 and a number of frequency analysers 4.1–4.m. On receiving an r.f. signal of a frequency lying within the frequency operating range of the discriminator 1.1 the detector 3 delivers a detection signal $R_1$. The output signals of the remaining frequency discriminators 1.2–1.n are designated by $R_2$–$R_n$.

Since the frequency analysers 4.1–4.m cannot be distinguished schematically, only the frequency analyser 4.1 is shown in detail in FIG. 1. Analyser 4.1 is provided with a phase detector 5, which is supplied with an r.f. signal from a passive radar receiver both directly and via a delay line 6. The detector 5 generates two output signals, $C_1 = K \cos \Omega$ and $S_1 = K \sin \phi$, where the amplitude K is equal to the standardised value of the signal applied to the detector and $\phi$ the phase angle produced in the delay line 6. The magnitude of the phase angle $\phi$ is given by the relationship: $\phi = 2\pi \cdot f \cdot L/V$, where f is the frequency of the applied r.f. signal, L the length of the delay line 6 and V the signal propagation velocity in this delay line. Thus an interdependence is obtained between the amplitude of the signal $C_1$ and the frequency f (see FIG. 3B) of the applied r.f. signal; this also applies to signal $S_1$ and frequency f. Since it is desirable that only unambiguous information on the frequency f is obtained from the signal $C_1 = K \cos \phi$, the phase variation $\Delta\phi$ of the phase angle $\phi$ in delay line 6 should be limited to $2\pi$ and therefore, $\Delta f \cdot L/V < 1$. This inequality also fixed the relationship between the unambiguous frequency interval ($f_3;f_4$) of discriminator 1.1 (see FIG. 2) and the maximum permissible length L of delay line 6. For practical reasons to be described later, the frequency band allocated to frequency discriminator 1.1 for the frequency measurement, that is the frequency measuring band $\Delta f_1$, will be smaller than the frequency interval ($f_3;f_4$). Consequently, the phase variation within the measuring band $\Delta f_1$ will be less than $2\pi$.

The generated signals $S_1$ and $C_1$ are applied to a summing circuit 7, from which a number of other signals are derived, as will be described later. The signals $C_1$ and $S_1$ are subsequently fed to a comparator 8, where the polarity of these signals is determined; signals with a positive polarity are converted into a "logically true" signal and signals with a negative polarity into a "logically untrue" signal. The logical signals so obtained are written into a buffer 9 by means of the output signal $R_1$ generated by detector 3.

The way in which signals $S_1$ and $C_1$ are examined for their polarity within the frequency operating range ($f_5;f_6$) is shown in FIGS. 3C and 3D respectively. By combining the logical signals obtained from $S_1$ and $C_1$, a division of the frequency operating range ($f_5;f_6$) into intervals is obtained, which intervals are designated by the number pairs (0,0), (0,1), (1,0) and (1,1), see FIG. 3E. Such a number pair indicates in which interval of the frequency operating range of discriminator 1.1 the frequency of the received r.f. signal resides. From FIG. 3E it can be observed that the intervals to which the number pairs (1,1) and (1,0) are added, are ambiguous. As already referred to in the introductory part, this narrows the frequency interval ($f_3;f_4$), allocated to discriminator 1.1 for a frequency measurement, to the ultimate frequency measuring band $\Delta f_1 = (f_1;f_2)$ hereinafter described in more detail.

A further division of each of the frequency intervals designated by a number pair is obtained by means of an adjoining frequency analyser 4.2. When the delay line in frequency analyser 4.2 is made four times as long as that of analyser 4.1, the phase shift detected by the phase detector of analyser 4.2 will be four times as large as in the case of analyser 4.1. Hence, the signals to be generated by the phase detector of frequency analyser 4.2 may then be represented by: $S_2 = K \sin 4\phi$ and $C_2 = K \cos 4\phi$, where $\phi$ is the phase shift within the delay line 6 of analyser 4.1. With the frequency analyser 4.2 thus designed a further (fourfold) division of each of the already obtained frequency intervals within the range ($f_5;f_6$) is possible, implying a refinement of the frequency measurement by a factor 4. This may not be applicable to the intervals at the boundaries of the range ($f_5;f_6$). The frequency intervals thus obtained with frequency analysers 4.1 and 4.2 within the frequency operating range ($f_5;f_6$) of discriminator 1.1 are characterised by a 4-bit binary code (see FIG. 3F). Each following frequency analyser further divides each of the already obtained frequency intervals of the range ($f_5;f_6$) into four parts, provided these intervals do not adjoin the range boundaries. Consequently, an increasing refinement of the frequency measurement is achieved. With the application of say four frequency analysers in each frequency discriminator, a division of the respective frequency interval ($f_3;f_4$) into $4^4 = 256$ frequency intervals is obtained. The latter intervals are then represented by an 8-bit binary code. From FIG. 3F it is also seen that some of the latter frequency intervals represented by identical binary codes appear at both the low and the high sides of the frequency operating range ($f_5;f_6$), so that these intervals are ambiguous. In FIG. 3F this concerns the frequency intervals represented by (1,1,0,1), (1,1,1,1) and (1,0,1,0). In general, the frequency intervals (1,1,0,1) near frequency $f_5$ and (1,0,1,0) near frequency $f_6$ will be smaller than the remaining frequency intervals represented by four bits. A further division of each of the obtained frequency intervals (1,0,1,0) is possible with the subsequent frequency analysers 4.3 and 4.4, thus giving 8-bit frequency intervals. The result is that a number of the then obtained frequency intervals within the interval (1,0,1,0) near frequency $f_5$ will not appear in the frequency interval also represented by (1,0,1,0) but in that near frequency $f_6$. Consequently, such frequency intervals are unambiguous and may therefore be considered to be within the frequency measuring band $\Delta f_1 = (f_1;f_2)$ allocated to the frequency discriminator 1.1. A similar argument applies to the frequency intervals within the invertals (1,1,0,1), which are near frequencies $f_5$ and $f_6$. Thus it is possible to define, within the frequency operating range of discriminator 1.1, an unambiguous frequency measuring band $\Delta f_1 = (f_1;f_2)$ to determine the frequency. Therefore the processed signals of discrminator 1.1, which are outside the frequency mesuring band $\Delta f_1$, provide ambiguous phase information and should therefore be suppressed by means of a digital filter as will be discussed later. In some cases, such r.f. signals, which are detected by discriminator 1.1 but are outside the band $\Delta f_1$, are also detected by the adjoining frequency discriminator 1.2, since its frequency operating range 2.2 overlaps that of discriminator 1.1. Because discriminator 1.2 is so dimensioned that its frequency measuring band $\Delta f_2$ adjoins that of discriminator 1.1, an r.f. signal detected by discriminators 1.1 and 1.2, but outside the measuring band $\Delta f_1$ will necessarily fall within the measuring band $\Delta f_2$. Hence, discriminator 1.2 produces usable phase information.

As already stated, the remaining frequency discriminators 1.2–1.n, not discussed in detail, are similar to frequency discriminator 1.1, but are tuned to different frequency measuring bands ($\Delta f_2, \ldots, \Delta f_n$,). see FIG. 2.

Further processing of the phase information obtained by one of the frequency discriminators 1.1–1.n into a numeric value representing the frequency is performed by common processing means 10, comprising at least a gate circuit 11, a decoder 12 and selection means 13. When a frequency discriminator 1.j, where j=1, 2, ..., n supplies the selection means 13 with the detection signal $R_j$ of the relevant detector to inform that the phase information of a received r.f. signal is stored in the buffer units of this discriminator, the selection means are capable to generate a response signal $H_j$, which is typical of discriminator 1.j. The signal $H_j$ is also applied to the gate circuit 11, which then passes the phase information from frequency discriminator 1.j to the decoder 12. However, an 8-bit value supplied to the decoder will lack an ordered array between this value and the frequency of the detected r.f. signal. On considering for example the number pairs producible by frequency analyser 4.1, these number pairs enable the division of the frequency measuring range (f3;f4) into frequency intervals, which are arranged in the following order: (0;1), (0;0), (1;0) and (1;1). These number pairs thus lack an ordered array in magnitude. To obtain however an ordered array of number pairs, a number pair ($S_1;C_1$) produced by frequency analyser 4.1 is coded as follows: ($S_1';C_1'$)=($S_1;C_1.S_1+C_1.S_1$). The row of unordered number pairs is therefore converted into the row with the number pairs (0;0), (0;1), (1;0) and (1;1), giving an ordered array. Also the number pairs from the remaining frequency analysers are subjected to such a process in decoder 12; ($S_i;C_i$)→($S_1';C_1'$)=($S_i;C_i.S_i+\overline{C_i}.S_i$) where i=2, ..., m.

However, an ordered digital number of 2m bits obtained from decoder 12 does not represent an absolute frequency value but a relative value within the frequency band $\Delta f_j$ of discriminator 1.j. To obtain an absolute value from such a measured relative frequency value, the common processing means 10 further comprises a frequency index register 14 and an adder 15. The signal $H_j$, typical of frequency discriminator 1.j and applied to the gate circuit 11 by selection means 13, is also fed to the index register 14. On receiving signal $H_j$, index register 14 delivers a digital code typical of frequency discriminator 1.j to adder 15, which also receives the digital code generated by decoder 12. From the two applied digital codes the adder 15 produces a new digital code now representing an absolute frequency. Since the most significant bit of the digital code from index register 14 is of greater significance than the most significant bit of the code supplied by decoder 12, the number of bits of a digital code generated by adder 15 is greater than the number bits of the code produced by decoder 12. In a preferred embodiment the number of bits of a digital code produced by adder 15 is two greater than that of a code generated by the decoder 12.

The number of bits of a digital code representing an absolute frequency value is however independent of the frequency band in which the frequency represented by this code resides. Consequently, a frequency in the L-band has a finer resolution than a frequency in the Ku-band. The resolution in a frequency band therefore depends on the frequency measuring band involved in the frequency measurement; thus the resolution of the L-band may differ by a factor 10 with respect to that of the Ku-band. To fix a lower limit to the resolution in the frequency to be measured, one or several of the least significant bits should be eliminated in the frequency measurements in the lower frequency bands. The common processing means 10 are thereto provided with a scale indicator 16. Depending on the frequency measuring band involved in the measurement, the scale indicator 16 leaves the number of bits in the obtained digital code unchanged (this is the case in the higher frequency bands), or omits one or several of the least significant bits of the code combination obtained (this is the case in the lower frequency bands). In practice, the latter means the shifting of the digital code over the same number of places in the direction of the least significant bit. The information required for such a shift is supplied by the selection means 13; the scale indicator 16 thereto also receives one of the signals $H_{1-n}$.

In the above description on the functioning of the units of the common processing means 10 it was assumed that at a random instant only one of the frequency discriminators 1.1–1.n detects a received r.f. signal and processes it to phase information. If this occurs for instance in frequency discriminator 1.k, the detection signal $R_k$ of the detector involved will be applied to the selection means 13, as already described; this causes the gate circuit 11 to be activated unconditionally by the signal $H_k$. The phase information stored in the buffer units of the frequency discriminator 1.k will then be applied to decoder 12.

There may however be situations in which a received r.f. signal is detected by two frequency discriminators simultaneously, for example 1.k and 1.l, as already referred to. In such situations the detectors of the two frequency discriminators will send a detection signal $R_k$ and $R_l$ respectively to selection means 13. Since the transfer of phase information can only be realised on a selective basis, selection means 13 in the embodiment in question contains a fixed priority selection system for selecting one of the two frequency analysers 1.k and 1.l. With such a selection system a frequency discriminator 1.k tuned to the lower frequency measuring range 2.k has perference over frequency discriminator 1.l, which is tuned to the higher frequency measuring range 2.l. In such a case the selection means apply the switching signal $H_k$ to gate circuit 11 to transfer the phase information of frequency discriminator 1.k to decoder 12. From this information the decoder 12 generates an ordered digital code for the summing circuit 15, while it must still be checked whether the digital code of decoder 12 obtained through discriminator 1.k indeed concerns a frequency within the (unambiguous) measuring band $\Delta f_k$ allocated to this discriminator. The common processing means 10 are thereto provided with a digital filter 17, checking whether the frequency represented by that digital code lies within the respective measuring band. In the case of a positive result of such a check, the digital code delivered by scale indicator 16 represents an unambiguous frequency value, which is indicated to selection means 13 by a signal B. If the digital code produced by decoder 12 represents an ambiguous frequency within the measuring band $\Delta f_k$, the digital filter 17 generates the signal B=0, which signal is applied to selection means 13. On receiving such a signal, the selection means 13 apply the signal $H_1$ to gate circuit 11, frequency index register 14 and scale indicator 16. Consequently, the gate circuit 11 is activated to pass the phase information of the following frequency discriminator 1.1 to be processed in means 10. As the measured frequency does not reside in the frequency band $\Delta f_k$, it must be contained in the frequency band $\Delta f_1$. In such a case a check by filter 17 is unnecessary.

A feasible embodiment of a digital filter 17 is obtained by two comparators 18 and 19, two memory parts 20 and 21, and a band indicator 22. Memory part 20 contains the digital codes, being a relative representation of the lower limit frequencies of all measuring bands $\Delta f_1 - \Delta f_n$. Memory part 21 stores similar digital codes, yet for the higher frequency values of the measuring bands $\Delta f_1 - \Delta f_n$.

With the generation of the selection signal $H_k$ by selection means 13 in response to the application of the detection signal $R_k$ of frequency discriminator 1.k, memory parts 20 and 21 are activated in addition to gate circuit 11, frequency index register 14 and scale indicator 16. This implies the selection of those locations of the two memory parts, which store the digital codes representing the higher or the lower frequency limits of the measuring band $\Delta f_k$. In comparator 18 the digital code from decoder 12 is then compared with the digital code of the lower frequency limit from memory part 20, while in comparator 19 the digital code from decoder 12 is compared with the digital code of the higher frequency limit from memory part 21. The output signals of the two comparators 18 and 19 are subsequently applied to the band indicator 22, supplying the selection means 13 with the logical signal B=1 if the digital code from decoder 12 is an unambiguous representation of the frequency, and with B=0 if the digital code is an ambiguous representation of the frequency. Since the digital code from decoder 12 is a relative representation of the frequency, a considerable limitation of the number of memory locations can be realised in each of the memory parts 20 and 21 by a suitable selection of the various frequency measuring bands and by a suitable dimensioning of the relevant frequency discriminators. In this way it is possible to use the same digital code of memory part 20 for a relative representation of several frequency limits, effecting a saving in the number of memory locations in this memory part; a similar saving is achieved for memory part 21.

Since in some cases an unambiguous frequency determination can only be realised by using two frequency discriminators operating in succession, any ambiguity as to the value of the measured frequency cannot be resolved until after the expiration of a period of time required for the operation of the two frequency discriminators. The common processing means 10 thereto comprises a control gate 23, connected to the scale indicator 16, and a time switch 24, delivering a control signal G to control gate 23 after the above period of time following on the receipt of one of the signals $R_{1-n}$. On the application of the control signal G the digital code then present in the scale indicator is made available as a reliable code via control gate 23.

Feasible embodiments of the selection means 13 are shown in FIGS. 4, 5 and 6, where the selection means comprises the following units:

(a) a priority selection circuit 25; in the situation when two frequency discriminators apply a detection signal to the selection means 13 simultaneously, circuit 25 selects the frequency discriminator being tuned to the lower of the frequency measuring bands for the transfer of phase information, the reasons being as follows:
1. The chance that in measuring the frequency of a signal the first harmonic is measured instead of a higher harmonic will then be greatest.
2. Since the chance of detection within a fixed small time interval is greater for signals having a high pulse repetition frequency than for signals having a low pulse repetition frequency and since the transmission frequency of a signal increases as the pulse repetition frequency increases, the number of frequency measurements on signals having a high transmission frequency would exceed the number of measurements on signals having a low transmission frequency by a considerable amount; by giving priority to discriminators having a lower frequency band over those having a higher frequency band, the disparity in number is eliminated to a certain extent.

The result of the selection check by priority selection circuit 25 is valid only as long as it is not shown that the frequency measurement produces a digital code representing an unambiguous frequency value (thus as long as B=1).

(b) a band selection circuit 26. In the period the digital filter 17 generates the signal B=1 the selection circuit 26 simply accepts the results of the check of circuit 25. However, as soon as filter 17 generates the signal B=0, indicating that the frequency determination by the common processing means 10 produces an ambiguous digital code, the frequency measurement on the received r.f. signal is repeated, but now with the aid of the following frequency discriminator tuned to the adjoining frequency band of lower priority, at least insofar the output of the relevant detector is "1".

Priority selection circuit 25 should therefore be so designed that, on the application of detection signals from various frequency discriminators, only the frequency discriminator tuned to the lower frequency measuring band receives priority. This is achieved by providing the priority selection circuit 25 with at least the logic switching units 27.2–27.n, each of which operating in accordance with the Boolean transfer function $$P^*_k = R_k \cdot \prod_{l=1}^{k-1} \overline{R_l}$$

where k=2, ..., n. Since $P^*_1 = R_1$, a logic switching unit 27.1 for the priority indication of discriminator 1.1 is superfluous. Since the output signal of the logic switching units 27.2–27.n may only be effective as long as it is not shown that the frequency measurement produces an ambiguous digital code (thus as long as B=1), the output signal $P_k$ must be complemented to $P_k = B \cdot P_k$. The priority selection circuit 25 is thereto provided with AND circuits 28.1–28.n; in the latter formular $P_k$ represents the priority selection signal used to assign (when $P_k = 1$) the priority to frequency discriminator 1.k, whilst $R_k$ represents the detection signal from the frequency discriminator 1.k. Thus the priority selection circuit will supply not more than one selection signal on the application of output signals from one or several detectors of the frequency discriminators, taking into account the given priority level.

To be able to store the various $R_k$ signals of the detectors and amplifiers within the priority selection circuit 25, it may be desirable to provide the priority selection circuit with logic storage cells 29.1–29.n, each of which being connected to the amplification and detection circuit of the frequency discriminator with the corresponding number. A feasible embodiment of these storage cells may be obtained by using bistable logical elements, which may consist of D flip-flops (see FIG. 4B), having the signal inputs R and $\bar{R}$, the signal outputs Q and $\bar{Q}$, and a master input M, where the signal at the Q-output is invariably equal to the inverse of the applied input signal R, provided however that at least the M-input receives a logical "1" signal. If the M-input receives a logical "0" signal, the output signal at Q is always equal to "1". To perform the required storage function, the M-input of elements 29 1–29.n (see FIG. 4A) constantly receives the "1" signal, while the detection signal $R_k$ is fed to the relevant signal input.

If however the digital filter 17 sends the signal B=0 to selection means 13, to indicate that a digital code representing an ambiguous frequency value has resulted from the phase information of the frequency discriminator 1.k-1 (thus $P_{k-1}=1$) allocated by circuit 25, the band selection circuit 26 is to ensure that the next frequency discriminator 1.k where k=2, 3, ..., n, sends phase information for an unambiguous frequency determination, provided this discriminator has produced the detection signal $R_k$. This is achieved by providing the band selection circuit 26 with at least n logic storage cells 30.2–30.n, which may again consist of D flip-flops, each of which being operative in accordance with the Boolean transfer function $S_k = \bar{B} \cdot R_k \cdot P^*_{k-1}$ where k=2, 3, ..., n. The R input receives the $R_k$ signal, and the M input the $\overline{B \cdot P^*_{k-1}}$ signal. In selection means 13 the $P_k$ signal from the priority selection circuit 25 and the $S_k$ signal from the logic storage cells 30.2–30.n are combined into $H_k = P_k + S_k = B \cdot P^*_k + \bar{B} \cdot R_k \cdot P^*_{k-1}$, where k=2, ..., n, using logic circuits 31.2–31.n. The combined signal is the output signal of selection means 13; it should be noted that $H_1 = P_1 = B \cdot R_1$.

The combined output signal $H_k$ may be transformed as follows:

$$H_k = Q_k \cdot \prod_{l=1}^{k-1} \bar{Q_l}$$

where $Q_k$ and $Q_l$ are equal to $R_k \cdot \overline{B \cdot P^*_k}$ and $R_1 \cdot \overline{B \cdot P^*_1}$ respectively and $H_1 = B \cdot R_1$.

FIG. 5 illustrates an embodiment of the band selection circuit 26, provided with logic switching units 32.2–32.n, having the transfer function:

$$H_k = Q_k \cdot \prod_{l=1}^{k-1} \bar{Q_l}$$

where k=2, ..., n, and with logic storage cells 30.1–30.n, having the transfer function $$Q_k = R_k \cdot \overline{B \cdot P^*_k}$$

where k=1, ..., n. Again, D flip-flops may be used for these storage cells, where the $R_k$ signal is fed to the R-input and the $\overline{B \cdot P^*_k}$ signal to the M-input. In the embodiment in question the M-input is thereto connected to a NAND gate fed with the B and $P^*_k$ signals.

Considering the selection means 13 of FIG. 5, it is seen that the priority selection circuit 25 and the band selection circuit 26 do not show any substantial differences. The real difference between the circuits 25 and 26 is the way in which the M-inputs of the logic storage cells 29.1–29.n and 30.1–30.n are fed. During the priority selection phase the M-inputs of logic storage cells 29.1–29.n, as well as those of logic storage cells 30.1–30.n, are logically true. During the frequency band check the digital filter 17 may cause a change in the signal to be fed to the M-input of logic storage cells 30.1–30.n. At this stage the priority selection circuit 25 is in fact no longer required; however, the logic signals $P^*_k$ from the outputs of circuit 25 should be available. In the priority selection phase (N=1) either the first or the second selection circuit (25 or 26) is thus required, while in the band selection phase (B=0) only the second selection circuit 26 is required, provided the results $P^*_k$ from the priority selection phase are available.

A favourable embodiment (see FIG. 6) is obtained by providing the selection means 13 with only one selection circuit of the type as that of the band selection circuit 26 and with a storage circuit 33 connected to the logic switching units 32.2–32.n. In the priority selection phase the checking process by the digital filter 17 is still continuing, so that B=1. As a result of this, the output signal from the NAND gates of storage cells 30.1–30.n and thus applied to the M-input of these cells is always "1", independent of the signal $P^*_k$ at the other input of the NAND gate.

In the priority selection phase the operation of selection means 13 is identical to that of priority selection circuit 26 in FIG. 5. The output signals of the logic switching units 32.2–32.n are written as $P^*_k$ signals into the storage circuit 33. After the band selection check by the digital filter 17 the required $P^*_k$ values must remain unchanged, requiring the storage circuit 33 to be of the type that stores the output signals $P^*_k$ of units 32.2–32.n only once per measuring cycle. In the band selection phase the $P^*_k$ values not subject to change, as well as the B signal, are fed to the input of the NAND gate of the relevant logic storage cell 30.k; in such a case the circuit shown in FIG. 6 functions as band selection circuit 26 in FIG. 5.

While retaining the defined resolution in the frequency measurement, it is possible to reduce the number (m) of frequency analysers by one. Thereto, on the application of signals $C_{m-1}$ and $S_{m-1}$, the summing circuit of frequency analyser $4_{m-1}$ produces the following signals: $S_{m-1} + C_{m-1}$, $S_{m-1} - C_{m-1}$, $S_{m-1} + 0.364\ C_{m-1}$, $S_{m-1} - 0.364\ C_{m-1}$, $C_{m-1} + 0.364\ S_{m-1}$ en $C_{m-1} - 0.364\ S_{m-1}$, as well as the signals $C_{m-1}$ and $S_{m-1}$. All of these signals are applied to the comparator which assigns a binary code to the polarity of each of these signals. From the signals thus coded the binary coded signals $S_{m-1}$, $C_{m-1}$, U and V are obtained:

$$U = C_{m-1}(\overline{S_{m-1} + C_{m-1}}) + \overline{C_{m-1}}(S_{m-1} + C_{m-1}) +$$

$$S_{m-1}(\overline{S_{m-1} - C_{m-1}}) + \overline{S_{m-1}}(S_{m-1} - C_{m-1})\text{ and}$$

$$V = U(W \cdot \bar{Z} + \bar{W} \cdot Z) + \bar{U}(\overline{W \cdot \bar{Z}} + \overline{\bar{W} \cdot Z})$$

where $$W = (S_{m-1} + 0.364\, C_{m-1}) \cdot \overline{(S_{m-1} - 0.364\, C_{m-1})} +$$

$$\overline{(S_{m-1} + 0.364\, C_{m-1})} \cdot (S_{m-1} - 0.364\, C_{m-1}) \text{ and}$$

$$Z = (C_{m-1} + 0.364\, S_{m-1}) \cdot \overline{(C_{m-1} - 0.364\, S_{m-1})} +$$

$$\overline{(C_{m-1} + 0.364\, S_{m-1})} \cdot (C_{m-1} - 0.364\, S_{m-1}).$$

This conversion, added to the conversion $C_i \rightarrow C_i'$ already discussed, produces a digital code consisting of m bits:

$$(S_1, C_1', S_2, C_2', \ldots, S_{m-1}, C'_{m-1}, P, Q);$$

this is obtained with m-1 frequency analysers!

Finally it should be noted that, with the determination of the polarity of a detected signal $S_i$ or $C_i$, considerable errors may be incurred in the vicinity of the zero-axis crossings of $S_i$ or $C_i$. Thus an erroneous determination of the polarity in the frequency analyser 4.1 corresponds with a shift of $\frac{1}{4}$ of the frequency measuring band allocated to the discriminator! Therefore, in an interval of about 20° about the zero-axis crossing of $S_i$ the polarity is determined in a different way with the aid of signals $S_i - 0.364\, C_i$ and $S_i + 0.364\, C_i$. In this interval the signals $S_i - 0.364\, C_i$ and $S_i + 0.364\, C_i$ are of opposite polarity, which can be used as a condition for reverting to the different method of determining the polarity. The latter method implies that the correct polarity of $S_i$ is determined from the results of $S_{i+1}.C_i + \overline{S_{i+1}}.\overline{C_i}$. A similar method is possible when determining the polarity of $C_i$; in the interval where the signals $C_i + 0.364\, S_i$ and $C_i - 0.364\, S_i$ are of opposite polarity, the correct polarity of $C_i$ is obtained by $S_{i+1}.\overline{S_i} + \overline{S_{i+1}}.S_i$. In this process the polarity of $S_{i+1}$ obtained through analyser 4.i+1 must be applied to analyser 4.i. From this it is also follows that the different method of determining the polarity is not applicable to the frequency analyser in determining the least significant bits.

What we claim is:

—1. Frequency measuring circuit in a passive radar receiver for producing a digital code representing the frequency of an r.f. signal received by the radar receiver, wherein the frequency measuring circuit comprises:

a. a number (N) of frequency discriminators, each having an ambiguous discriminator characteristic, which discriminators are tuned to different r.f. frequency ranges, partly overlapping each other if they are tuned to adjoining frequency operating ranges, and which discriminators incorporate a plurality of frequency analysers for the phase detection of the applied r.f. signals in two trigonometric components, said r.f. signals being passed via delay lines of different lengths for each of the analysers, and for the binary coding of the polarity of the signals thus obtained by detection;

b. a decoder which can be connected to each of the frequency discriminators via a gate circuit and which converts the composite of binary coded polarities of the analysers pertaining to the connected discriminator into a digital code representing a frequency which may be ambiguous within the frequency range of said discriminator;

c. a digital filter being tunable to each of the discriminators and having a passband corresponding with the unambiguous part of the relevant discriminator characteristic, which digital filter delivers a signal on the application of the digital code from the decoder to indicate whether the binary representation of the frequency value within the frequency operating range of said discriminator is ambiguous or not, which digital filter, after receiving a digital code being an ambiguous representation of the frequency opens said gate circuit for the connection of the decoder to a frequency discriminator tuned to an adjoining frequency operating range;

d. a combination circuit for producing a digital code being an unambiguous representation of the measured frequency and consisting of the digital code from said decoder and the digital code representing the frequency band of the then connected frequency discriminator.

2. Frequency measuring circuit as claimed in claim 1, wherein the frequency measuring circuit is provided with selection means which, after receiving detection signals generated by at least one frequency discriminator activated on the detection of the r.f. signal opens the gate circuit to connect the decoder to one frequency discriminator so activated, and wherein the digital filter is tuned to the passband of said activated frequency discriminator.

3. Frequency measuring circuit as claimed in claim 2, wherein, on the application of the signal delivered by the digital filter to indicate an ambiguous frequency representation, the selection means are capable to bring the gate circuit in the open condition to connect the decoder to an adjoining frequency discriminator.

4. Frequency measuring circuit as claimed in claim 3, wherein the selection means opens the gate circuit to connect the decoder to an adjoining frequency discriminator, only if the selection means receives the control signal from the frequency discriminator then to be connected to the decoder, as well as the signal delivered by the digital filter to indicate an ambiguous frequency representation.

5. Frequency measuring circuit as claimed in claim 2, wherein the selection means are provided with N logical switching units of which the logical switching unit k, where $k = 1, \ldots, N$ operates in accordance with the Boolean transfer function $$P_k = R_k \cdot \prod_{l=1}^{k-1} \overline{R_l}$$

where $P_1 = R_1$, for establishing the connection of the decoder to the frequency discriminator k by means of the gate circuit except for the case when the selection means is fed with the signal delivered by the digital filter to indicate an ambiguous frequency representation, whereby $R_k$ represents said control signal in logical form, which control signal is generated by the frequency discriminator k on the detection of the r.f. signal.

6. Frequency measuring circuit as claimed in claim 5, wherein the selection means are provided with a combination circuit connected to the N logical switching units, said combination circuit operating in accordance with the Boolean transfer function $G_k = B.P_k$, where $k = 1, \ldots, N$, for establishing the connection of the decoder to the frequency discriminator k via the gate circuit on the application of the logical signals $P_k$ and B, the latter of which signals being the signal generated by the digital filter and having the logical value "1" except for the case when the frequency representation of the digital code applied to the digital filter is ambiguous.

7. Frequency measuring circuit as claimed in claim 6, wherein the selection means are provided with N logical switching units connected to the combination circuit, of which units the logical switching unit k, where $k=1, \ldots, N$ operates in accordance with the Boolean transfer function $H_k = G_k + R_k \cdot P_{k-1} \cdot \overline{B}$ for obtaining a control signal for the gate circuit to connect the decoder to the frequency discriminator k.

8. Frequency measuring circuit as claimed in claim 5, wherein the selection means are provided with N logical switching units of which the logical switching unit k, where $k=1, \ldots, N$, operates in accordance with the Boolean transfer function:

$$H_k = Q_k \cdot \prod_{l=1}^{k-1} \overline{Q_l}$$

where $H_1 = R_1$ and $Q_k = R_k \cdot \overline{\overline{B} \cdot P_k}$ for obtaining a control signal for the gate circuit to connect the decoder to the frequency discriminator k, in which transfer function B represents the signal generated by the digital filter, which signal has the logical "1" value except for the case when the frequency representation of the digital code applied to the digital filter is ambiguous.

9. Frequency measuring circuit as claimed in claim 2, wherein the selection means are provided with N logical switching units and with a memory circuit of N memory locations, which is connected to the output of the switching units, whereby information can be stored in said memory circuit only once in each frequency measurement, and whereby the logical switching unit k, where $k=1, \ldots, N$, operates in accordance with the Boolean transfer function:

$$H_k = Q_k \cdot \prod_{l=1}^{k-1} \overline{Q_l}$$

where $H_1 = R_1$ and $Q_k = R_k \cdot \overline{\overline{B} \cdot P_k}$, for obtaining a control signal for the gate circuit to connect the decoder to the frequency discriminator k, in which transfer function:

a. $R_k$ represents said control signal in logical form, which control signal is generated by the frequency discriminator k on the detection of the r.f. signal;

b. B represents the signal generated by the digital filter, which signal has the logical "1" value except for the case when the frequency representation of the digital code applied to the digital filter is ambiguous;

c. $P_k$ represents the output signal of the memory circuit location connected to the logical switching unit k.

10. Frequency measuring circuit as claimed in claim 2, wherein the digital filter comprises:

a. a first and a second register storing digital codes which represent respectively the lower and the higher limit frequencies residing in the unambiguously defined parts of the frequency bands of the frequency discriminators, from which digital codes the selection means select the codes which correspond with the limit frequencies of the passband of the frequency discriminator to be connected to the decoder;

b. a first and a second comparator, comparing the code from the decoder with the code selected in the first and the second register, respectively;

c. a band indicator which generates the signal to indicate an ambiguous or unambiguous frequency representation with respect to said passband.

11. Frequency measuring circuit as claimed in claim 2, wherein the combination circuit is provided with an adder connected to the decoder and with a frequency index register storing the digital codes representing the frequency band of the frequency discriminators, which frequency index register, under control of the selection means, supplies the adder with the digital code representing the frequency band of the frequency discriminator to be connected to the decoder to combine said digital code with the digital code from the decoder.

12. Frequency measuring circuit as claimed in claim 11, wherein the combination circuit is provided with a scale indicator connected to the adder and controlled by the selection means, to select a number of the most significant bits of the adder-supplied digital code, providing a rounded-off digital code which represents the measured frequency.

13. Frequency measuring circuit as claimed in claim 1, wherein the combination circuit is provided with a control gate for passing the digital code from the combination circuit, which digital code represents the measured frequency, after a given time duration following on the receipt of an r.f. signal by a frequency discriminator.

* * * * *